United States Patent
Benhamouda et al.

(10) Patent No.: US 8,228,121 B2
(45) Date of Patent: Jul. 24, 2012

(54) AUTOMATIC GAIN CONTROL CIRCUIT

(75) Inventors: Franck Benhamouda, Plaisir (FR); Ros Kiri Ing, Paris (FR); Jean-Michel Linotte, Paris (FR)

(73) Assignee: Tyco Electronics Services GmbH, Schaffenhausen (CH)

( * ) Notice: Subject to any disclaimer, the term of this patent is extended or adjusted under 35 U.S.C. 154(b) by 161 days.

(21) Appl. No.: 12/446,943

(22) PCT Filed: Oct. 25, 2006

(86) PCT No.: PCT/IB2006/002988
§ 371 (c)(1),
(2), (4) Date: Jul. 31, 2009

(87) PCT Pub. No.: WO2008/050171
PCT Pub. Date: May 2, 2008

(65) Prior Publication Data
US 2010/0090763 A1  Apr. 15, 2010

(51) Int. Cl.
*H03F 3/30* (2006.01)
(52) U.S. Cl. .......................... 330/279; 330/86
(58) Field of Classification Search .................... 330/86, 330/129, 279, 282, 285
See application file for complete search history.

(56) References Cited

U.S. PATENT DOCUMENTS

| | | |
|---|---|---|
| 3,997,914 A | 12/1976 | White |
| 5,606,284 A | 2/1997 | Tamesue et al. |
| 5,633,940 A | 5/1997 | Wassink |
| 5,955,925 A | 9/1999 | Segawa et al. |
| 6,420,934 B1 * | 7/2002 | Butler et al. .................. 330/279 |
| 6,510,188 B1 | 1/2003 | Isaksen et al. |
| 6,597,898 B1 | 7/2003 | Iwata et al. |
| 2002/0150266 A1 | 10/2002 | Hinkle et al. |
| 2003/0091126 A1 | 5/2003 | Rabii |
| 2003/0179046 A1 | 9/2003 | Lin et al. |
| 2005/0032496 A1 | 2/2005 | Saeki |

(Continued)

FOREIGN PATENT DOCUMENTS

AU            668243            4/1996

(Continued)

OTHER PUBLICATIONS

International Search Report from corresponding PCT/IN2006/002988 dated Jul. 16, 2007.

(Continued)

*Primary Examiner* — Khanh V Nguyen
(74) *Attorney, Agent, or Firm* — Marshall, Gerstein & Borun LLP

(57) ABSTRACT

An automatic gain control circuit including a variable gain amplifier (11) adapted to receive a received signal (R) and to output an amplified signal (A) to an analog to digital converter (20), and a gain controller (12) which is connected to said variable gain amplifier (11) for receiving said amplified signal (A) and for controlling a gain of said variable gain amplifier (11). The gain controller (12) is adapted to determine an occurrence of a threshold event each time the amplified signal (A) has reached a predetermined threshold, decrease the gain of the variable gain amplifier (11) at each occurrence of a threshold event, measure a delay since the last threshold event, increase the gain of the variable gain amplifier (11) if the delay is greater than a delay specified value and if the gain of the variable gain amplifier (11) is not maximum.

17 Claims, 2 Drawing Sheets

U.S. PATENT DOCUMENTS

| | | |
|---|---|---|
| 2006/0044065 A1 | 3/2006 | Ishida |
| 2008/0007543 A1 | 1/2008 | D'souza |
| 2009/0161888 A1* | 6/2009 | Okada .......................... 330/278 |

FOREIGN PATENT DOCUMENTS

| | | |
|---|---|---|
| EP | 0 604 295 | 6/1994 |
| EP | 0 803 977 | 10/1997 |
| EP | 0 929 150 | 7/1999 |
| EP | 1 427 102 | 6/2004 |
| JP | 61263303 | 11/1986 |
| JP | 61263304 | 11/1986 |
| JP | 7-079124 A | 3/1995 |
| JP | 7263986 | 10/1995 |
| JP | 11-251851 A | 9/1999 |
| JP | 2001/274645 A | 10/2001 |
| JP | 2002/534005 T | 10/2002 |
| JP | 2004153718 | 5/2004 |
| WO | WO-00/30025 A1 | 5/2000 |
| WO | WO-00/38409 A1 | 6/2000 |
| WO | WO-03/005292 A1 | 1/2003 |
| WO | WO-03/067511 A2 | 8/2003 |

OTHER PUBLICATIONS

Written Opinion from corresponding PCT/IN2006/002988 dated Jul. 16, 2007.

International Search Report issued in PCT/IB2006/002988 mailed on Jul. 16, 2007.

* cited by examiner

AUTOMATIC GAIN CONTROL CIRCUIT

FIELD OF THE INVENTION

The present invention concerns an automatic gain control (AGC) circuit, a system including such circuit and a method for automatic gain control.

BACKGROUND OF THE INVENTION

The present invention concerns more precisely an automatic gain control (AGC) circuit including:
  a variable gain amplifier (VGA) adapted to receive a received signal and to output an amplified signal to an analog to digital converter (ADC),
  and a gain controller (GC) which is connected to said variable gain amplifier for receiving said amplified signal and for controlling a gain of said variable gain amplifier.

When the received signal is coming for instance from a vibration sensor, the received signal can be an impulsive signal with variations in amplitude of several orders of magnitude.

Generally, low input gain and high resolution analog to digital converters (ADC) are used to convert such received signal. But when the received signal is an impulsive signal, it is necessary to tune an important margin between the ADC full scale input voltage range and the received signal maximum voltage. That is why most of time, the amplified signal has a very small amplitude and is noisy. Moreover, the use of high resolution ADC is costly.

Another way is to use an automatic gain control (AGC) circuit in front of the ADC. An AGC refers to a circuit which gain varies substantially depending on the magnitude of the received signal so as to maintain the amplified signal level substantially constant. As described is U.S. Pat. No. 5,606,284, the AGC circuit comprises at least one analog amplifier for the received signal which is automatically controlled by an analog feedback signal. Unfortunately amplified signal must be integrated in the feedback loop to produce the VGA gain control voltage. Thus, time constant must be sufficiently large and such AGC circuit is not well adapted to impulsive signals with lots of variations in amplitudes.

OBJECTS AND SUMMARY OF THE INVENTION

An object of the present invention is to solve this problem by providing an efficient circuit for automatic gain control that does not require an integrator circuit.

To this effect, the gain controller is adapted to:
determine an occurrence of a threshold event each time the amplified signal has reached a predetermined threshold,
decrease the gain of the variable gain amplifier at each occurrence of a threshold event,
measure a delay since the last threshold event,
increase the gain of the variable gain amplifier if the delay is greater than a delay specified value and if the gain of the variable gain amplifier is not maximum.

Thanks to this regulation of the gain of the VGA, it is possible to anticipate received signal amplitude change even during first impulses and it is possible to get a constant signal-to-noise ration (SNR) in spite of change of received signal magnitude. Moreover, the cost of the VGA and the gain controller is relatively low and supposed lower than a high resolution ADC which has a variable quantization noise.

In preferred embodiments of the automatic gain control circuit proposed by the invention, one and/or the other of the following features may optionally be incorporated:
  the gain controller is adapted to command the change of gain of the variable gain amplifier between two samples of the analog to digital converter conversion;
  the gain controller is adapted to send via a serial bus a first digital value given by the analog to digital converter and a second digital value representing the gain of the variable gain amplifier;
  at each occurrence of a threshold event and if the gain of the variable gain amplifier is not minimum, the gain controller decreases the gain of the variable gain amplifier by a factor multiple of two;
  at each occurrence of a threshold event and if the gain of the variable gain amplifier is not minimum, the gain controller decreases the gain of the variable gain amplifier by a predetermined value depending on the absolute difference between two successive first digital value;
  if the delay is greater than a delay specified value and if the gain of the variable gain amplifier is not maximum, the gain controller increases the gain of the variable gain amplifier by a factor multiple of two;
  the gain controller is a programmable logic device;
  the automatic gain control circuit is an application specific integrated circuit;
  the gain controller is able to manage two channels, with two analog to digital converters and two variable gain amplifiers, each of then in one or two circuits;
  variable gain amplifier is further composed of an inverting amplifier with a digital potentiometer.

Another object of the invention is a system including an automatic gain control circuit, further including an analog to digital converter connected to said automatic gain control circuit for receiving said amplified signal from said variable gain amplifier.

The system may further include a vibration sensor connected to said variable gain amplifier, wherein said received signal is received by said variable gain amplifier from said vibration sensor.

Another object of the invention is to provide an efficient method for automatic gain control of a variable gain amplifier amplifying a received signal and outputting an amplified signal comprising the steps of:
  determining an occurrence of a threshold event each time the amplified signal has reached a predetermined threshold,
  decreasing the gain of the variable gain amplifier at each occurrence of a threshold event,
  measuring a delay since the last threshold event,
  increasing the gain of the variable gain amplifier if the delay is greater than a delay specified value and if the gain of the variable gain amplifier is not maximum.

BRIEF DESCRIPTION OF THE DRAWINGS

Other features and advantages of the invention will be apparent from the following detailed description of one of its embodiments given by way of non-limiting example, with reference to the accompanying drawings. In the drawings.

MORE DETAILED DESCRIPTION

Figure 1:
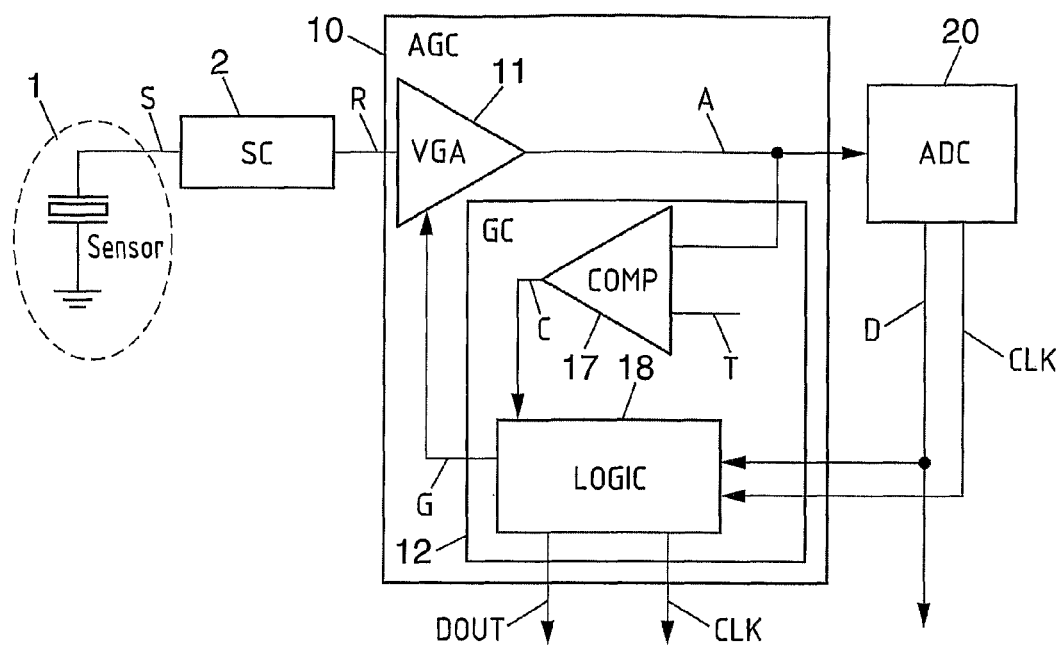
FIG. 1 is a block diagram of an automatic gain control (AGC) circuit according to the invention.

In FIG. 1, a sensor 1 is producing a sensor signal S, for example representing vibrations of an object. In that case, the sensor could be a piezoelectric element. This sensor signal S is imputed in a signal conditioning (SC) circuit 2 which can be composed at least of a filter to reduce high frequency noise of sensor signal S and is outputting a received signal R. The automatic gain control (AGC) circuit 10 receives said received signal R to produce an amplified signal A, which is converted into digital data D by an analog to digital converter (ADC) 20.

For example, the ADC 20 may be a Texas Instruments PCM1803 which is a high-performance, low-cost, single-chip stereo analog to digital converter. In that case, the ADC 20 is able to give to the AGC circuit 10 a clock signal CLK for synchronization of serial audio digital data D and a left-right signal LRCLK for defining if current converted data D is from the left or right input channel. These additional signals are useful for the AGC circuit 10 to synchronize with ADC and to identify each sample.

The automatic gain control (AGC) circuit 10 is at least composed of a variable gain amplifier (VGA) 11 and a gain controller (GC) 12.

Figure 2:
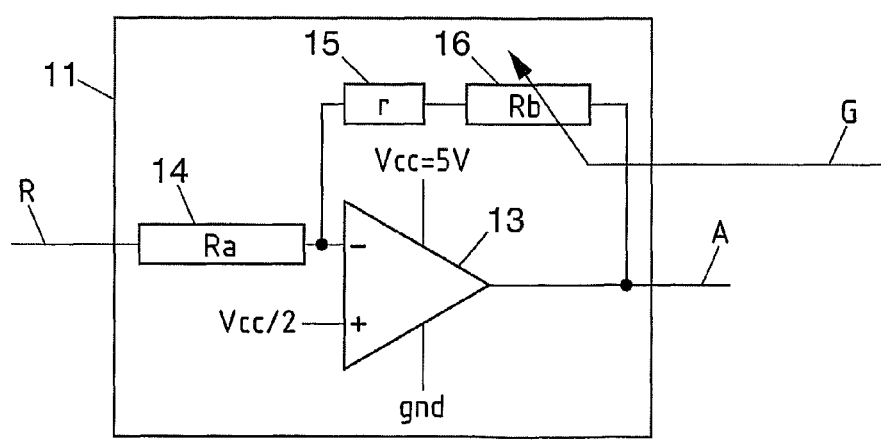
FIG. 2 is a block diagram of a variable gain amplifier (VGA)

The VGA may be developed as exposed in FIG. 2. It is an inverting amplifier 13, eventually with signal centered on Vcc/2, which is half of amplifier supply voltage Vcc. This amplification stage uses three resistors: an input resistor 14 (of resistance Ra), a first feedback resistor 15 (of resistance r) and a second feedback resistor 16 (of resistance Rb). First and second feedback resistors 15, 16 are connected in series. Then, the gain of inverting amplifier 13 is given by the following formula:

$$\text{Gain} = -\frac{Rb + r}{Ra} \quad (1)$$

This kind of simple inverting amplifier permits to get a large range of gain by tuning its resistors values.

Second feedback resistor 16 is a programmable variable resistor, also called a digital potentiometer. An example of that kind of resistor is the Analog Devices AD5162 which is a dual 256-position Serial Peripheral Interface (SPI) digital potentiometer. The SPI bus is a 4-wire synchronous serial communications interface used by many microprocessor peripheral chips for connecting at a relatively low speed. This SPI bus can be used in the AGC to communicate a digital gain value G from the Gain Controller (GC) 12 to the Variable Gain Amplifier (VGA) 11.

In the case of a 8-bit digital potentiometer, like the AD5162, the digital gain value G can take any integer value between zero and 255. The resistance value Rb of the second feedback resistor 16 is given by a simple linear formula:

$$Rb = \frac{G}{256} \cdot Re + Rw \quad (2)$$

Where Re is the end to end resistance value (maximum resistance value) and Rw is the wiper contact resistance (the minimum resistance value).

The first feedback resistor 15 of the inverting amplifier 13 can help to compensate the wiper resistance Rw effect. Thus, it may be possible to have real evolutions of the gain of inverting amplifier 13 by factors of two, for instance:

The gain controller (GC) is detailed in FIG. 1 and is itself composed of a signal comparator 17 and a logic circuit 18.

The signal comparator 17 is comparing the amplified signal A to a threshold T, and outputting the binary comparison signal C.

In the general case with a non centered amplified signal A, the comparator 17 is comparing the amplified signal A to thresholds T1 and T2. If amplified signal A is greater than threshold T1 or lower than threshold T2 the comparison signal C will be in the true state represented by a Vcc voltage of comparison signal C, otherwise the comparison signal C will be in the false state represented by a zero or ground voltage.

In practice, only one threshold T is used to define the comparison signal C. In case of a centered signal around zero volts, the comparison signal C is determined as in the general case above with T1 equal to T and T2 equal to −T. In case of a centered signal around Vcc/2 volts, the comparison signal C is determined as in the general case above with T1 equal to Vcc/2+T and T2 equal to Vcc/2−T.

Figure 3:
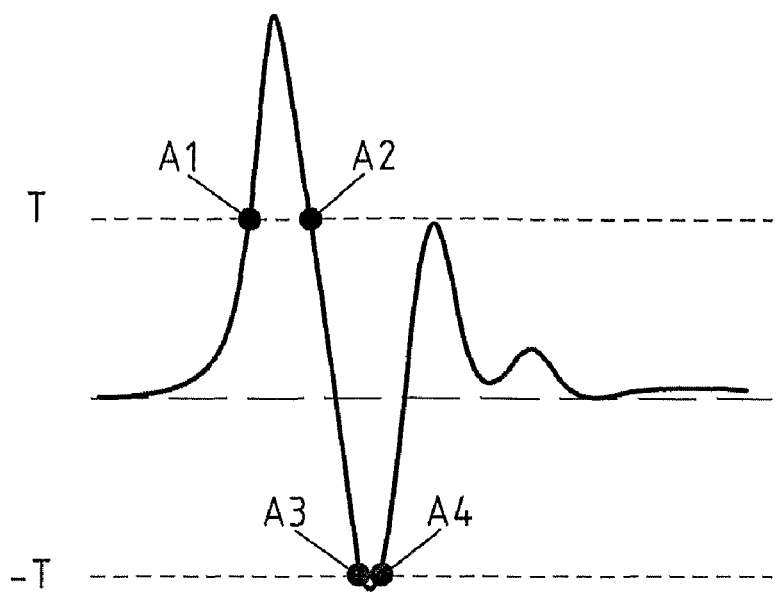
FIG. 3 represents a receiving signal.
Figure 4:
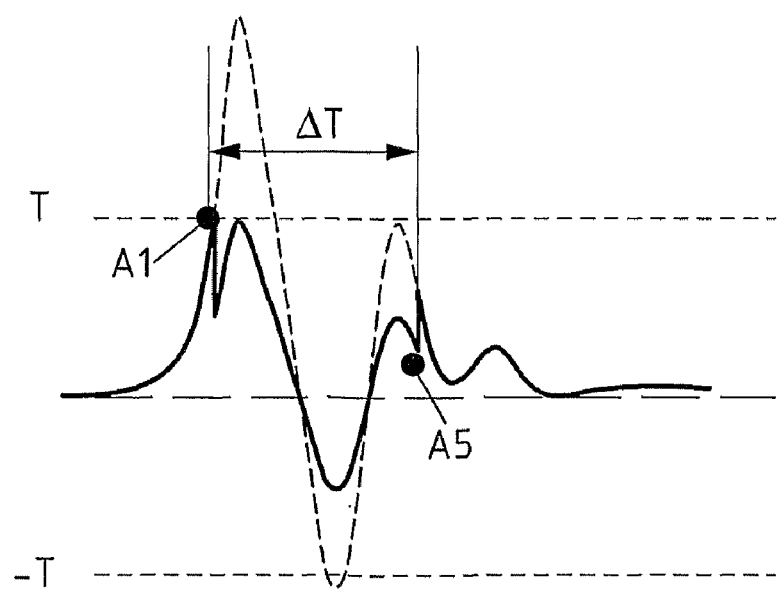
FIG. 4 represents the amplified signal of the received signal of FIG. 3.

FIGS. 1, 3 and 4 are representing a block diagram and signals with centered signal around zero volt, and related description is based on a centered signal around zero volt.

The logic circuit 18 is using the comparison signal C and the ADC digital data D and ADC clock signal CLK to provide the said digital gain value G for the VGA 11 and to provide a completed digital data DOUT and a clock signal CLK to a user circuit (not shown) such as a microcontroller or a microprocessor or a digital signal processor (DSP).

The logic circuit 18 can be made by using several logic gate circuits connected together, or by using a Programmable Logic Device (PLD) such as a PAL device (Programmable Logic Array) or a GAL device (Generic Array Logic) or a CPLD device (Complex Programmable Logic Device) or a FPGA device (Field-Programmable Gate Array), or by using an Application Specific Integrated Circuit (ASIC), or any device of the like to implement all the bellow described logic. These PLD are programmed by using a language called Hardware Description Language (HDL). The ASIC can eventually integrate all or any of all the functions of the AGC circuit 10, e.g. including the signal SC circuit 2, the VGA circuit 11, the GC circuit 12 and the ADC circuit 20. Then, for high production volumes, ASIC design may be more cost effective than PLD design.

At initialisation, the logic circuit 18 is setting the gain value G of the VGA at the maximum value (e.g. 255, in case of a 8-bit digital potentiometer).

Then, the logic circuit 18 is determining an occurrence of a threshold event each time the amplified signal A has reached the predetermined threshold T, that is to say, each time the comparison signal C is equal to true state.

For each threshold event, the logic circuit 18 decreases the gain of the VGA by decreasing its output gain value G (e.g. the gain is decreased by a factor of two in changing the digital gain value G).

The logic circuit 18 also measures the delay since last threshold event. This can be done by simply counting samples since last true state of comparison signal C. In case of the use of PCM1803 stereo ADC, the logic circuit 18 only need to count the rising edges of left-right signal LRCLK.

If the gain of the VGA is not maximum (e.g. 255) and if the measured delay is greater than a specified value ΔT, the logic circuit 18 increases the gain of the VGA by increasing the digital gain value G (e.g. the gain is increased by a factor of two in changing the digital gain value G).

If a new threshold event happens before the measured delay becomes greater than said specified value ΔT, the logic circuit 18 decreases the gain of the VGA by decreasing its output gain value G and the delay is simply initialized to zero value. Then, the gain of the VGA can be increased a first time after a delay of ΔT if no threshold event occurs and a second time after a delay of 2.ΔT if no threshold event occurs. Another way to do this is to initialize the delay to a zero value when the gain of the VGA is firstly increased. In that case, if the gain of the VGA can be increased a second time after a delay of ΔT if no threshold event occurs (since last initialization of delay).

The logic circuit 18 is providing to a user circuit a completed digital data DOUT which is merging the digital data D from ADC and the digital gain value G of VGA, so that the user microprocessor circuit can calculate the real value of received signal R. In case of two channels (with two ADCs or a two channel ADC), the logic circuit 18 is also managing all these devices and providing a completed digital data DOUT merging the digital data D of left channel, gain value G of VGA of left channel, digital data D of right channel, gain value G of VGA of right channel, and providing a LRCLK signal for defining if current data in DOUT is from the left or right input channel.

In a second embodiment of the invention, the gain of the VGA 11 may be increased or decreased by a predetermined factor value, which could be for instance two or four or a multiple of two.

In a third embodiment of the invention, the logic circuit 18 is calculating the absolute difference DIFF between two successive digital data D from ADC 20, at each occurrence of a threshold event:

$$DIFF=abs(D(n)-D(n-1)) \quad (3)$$

Where:
T is a sampling period of the ADC,
n is referring to sampling instant nT,
n−1 is referring to the previous sampling instant (n−1) T,
D(n) is the digital data D from ADC 20 at instant nT,
D(n−1) is the digital data D from ADC 20 at instant (n−1)T.

If the absolute difference DIFF is lower than a predetermined value the gain is decreased by a first factor, for example of two, else the gain is decreased by a second factor higher than said first factor, for example of four.

Thanks to this third embodiment of the invention, the gain of the VGA 11 is automatically decreased by a predetermined factor value and the gain of the VGA 11 is simply and well adapted to amplified signal A evolution.

FIG. 3 represents the typical amplified signal A from the vibration sensor 1 without the automatic gain amplifier of the invention, looking like an impulse response of a vibration structure with a first high impulse and following smaller and smaller oscillation amplitudes. Speed of decreasing of the oscillation amplitude depends at least on damping characteristics of the vibration structure. As it can be seen on FIG. 3, it can be difficult to keep this amplified signal A bellow threshold T, and after two or three oscillations amplified signal A becomes very small. That type of signal leads to saturation problems and then to poor signal-to-noise ratio.

For example, between A1 and A2 and between A3 and A4, the amplified signal A exceeds threshold level T, with a high risk of saturation and non linearity of amplifier.

FIG. 4 represents the same amplified signal A with the automatic gain amplifier of the invention. When the signal reach threshold level T at A1, then the gain controller 12 decrease the VGA 11 gain and the signal is falling down, staying bellow threshold T level. After a predetermined delay ΔT, the amplified signal A is at A5 and the gain controller 12 is increasing back the gain of the VGA 11, producing another step in the signal now following the unmodified signal. This example is demonstrating how the AGC 10 is keeping amplified signal A bellow the threshold T.

The ACG of the invention is continuously adapting variable gain amplifier gain value to keep the signal bellow threshold and with a maximum amplification. That is why the signal-to-noise ration (SNR) of amplified signal is kept as constant and as high as possible. With these devices and method it is possible to get a precise analog-to-digital conversion of received signal, at a lower cost than with a high resolution analog to digital converter.

The invention claimed is:

1. An automatic gain control circuit including:
a variable gain amplifier adapted to receive a received signal and to output an amplified signal to an analog to digital converter,
and a gain controller which is connected to said variable gain amplifier for receiving said amplified signal and for controlling a gain of said variable gain amplifier, wherein the gain controller is adapted to:
determine an occurrence of a threshold event each time the amplified signal has reached a predetermined threshold,
decrease the gain of the variable gain amplifier at each occurrence of a threshold event,
measure a delay since the last threshold event,
increase the gain of the variable gain amplifier if the delay is greater than a delay specified value and if the gain of the variable gain amplifier is not maximum.

2. An automatic gain control circuit according to claim 1, wherein the gain controller is adapted to command the change of gain of the variable gain amplifier between two samples of the analog to digital converter conversion.

3. An automatic gain control circuit according to claim 1, wherein the gain controller is adapted to send via a serial bus a first digital value given by the analog to digital converter and a second digital value representing the gain of the variable gain amplifier.

4. An automatic gain control circuit according to claim 1, wherein at each occurrence of a threshold event and if the gain of the variable gain amplifier is not minimum, the gain controller decreases the gain of the variable gain amplifier by a factor multiple of two.

5. An automatic gain control circuit according to claim 3, wherein at each occurrence of a threshold event and if the gain of the variable gain amplifier is not minimum, the gain controller decreases the gain of the variable gain amplifier by a predetermined value depending on the absolute difference between two successive first digital values.

6. An automatic gain control circuit according to claim 1, wherein if the delay is greater than a delay specified value and if the gain of the variable gain amplifier is not maximum, the gain controller increases the gain of the variable gain amplifier by a factor multiple of two.

7. An automatic gain control circuit according to claim 1, wherein the gain controller is a programmable logic device (PLD).

8. An automatic gain control circuit according to claim 1, wherein the automatic gain control circuit is an application specific integrated circuit (ASIC).

9. An automatic gain control circuit according to claim 1, wherein the gain controller is able to manage two channels, with two analog to digital converters and two variable gain amplifiers, each of them in one or two circuits.

10. An automatic gain control circuit according to claim 1, wherein the variable gain amplifier is further composed of an inverting amplifier with a digital potentiometer.

11. An automatic gain control circuit according to claim 1, further including a vibration sensor connected to said variable gain amplifier, wherein said received signal is received by said variable gain amplifier from said vibration sensor.

12. A method for automatic gain control of a variable gain amplifier amplifying a received signal and outputting an amplified signal comprising:
   determining an occurrence of a threshold event each time the amplified signal has reached a predetermined threshold, decreasing the gain of the variable gain amplifier at each occurrence of a threshold event,
   measuring a delay since the last threshold event, increasing the gain of the variable gain amplifier if the delay is greater than a delay specified value and if the gain of the variable gain amplifier is not maximum.

13. The method according to claim 12, including determining if the gain of the variable gain amplifier is not minimum, and decreasing the gain of the variable gain amplifier by a factor multiple of two at each occurrence of a threshold event.

14. A method for automatic gain control of a variable gain amplifier amplifying a received signal and outputting an amplified signal comprising:
   determining an occurrence of a threshold event each time the amplified signal has reached a predetermined threshold, decreasing the gain of the variable gain amplifier at each occurrence of a threshold event;
   measuring a delay since the last threshold event, increasing the gain of the variable gain amplifier if the delay is greater than a delay specified value and if the gain of the variable gain amplifier is not maximum; and
   providing a gain controller, and adapting the gain controller to command the change of gain of the variable gain amplifier between two samples of an analog to digital converter conversion.

15. The method according to claim 14, including adapting the gain controller to send via a serial bus a first digital value given by the analog to digital converter and a second digital value representing the gain of the variable gain amplifier.

16. The method according to claim 14, including determining if the gain of the variable gain amplifier is not minimum and, at each occurrence of a threshold event, using the gain controller to decrease the gain of the variable gain amplifier by a predetermined value depending on the absolute difference between two successive first digital values.

17. The method according to claim 14, including arranging the gain controller to increase the gain of the variable gain amplifier by a factor multiple of two if the delay is greater than a delay specified value and if the gain of the variable gain amplifier is not maximum.

* * * * *